(12) United States Patent
Lamesch et al.

(10) Patent No.: US 12,221,015 B2
(45) Date of Patent: Feb. 11, 2025

(54) SENSOR ARRANGEMENT FOR CAPACITIVE POSITION DETECTION OF AN OBJECT

(71) Applicant: IEE INTERNATIONAL ELECTRONICS & ENGINEERING S.A., Echternach (LU)

(72) Inventors: Laurent Lamesch, Reichlange (LU); Tobias Pampel, Trier (DE); Michael Puetz, Trier (DE); Bertrand Rue, Kleinbettingen (LU); Laurent Vanstraelen, Arlon (BE)

(73) Assignee: IEE INTERNATIONAL ELECTRONICS & ENGINEERING S.A., Echternach (LU)

( * ) Notice: Subject to any disclaimer, the term of this patent is extended or adjusted under 35 U.S.C. 154(b) by 278 days.

(21) Appl. No.: 17/796,554

(22) PCT Filed: Jan. 25, 2021

(86) PCT No.: PCT/EP2021/051613
§ 371 (c)(1),
(2) Date: Jul. 29, 2022

(87) PCT Pub. No.: WO2021/151835
PCT Pub. Date: Aug. 5, 2021

(65) Prior Publication Data
US 2023/0046256 A1 Feb. 16, 2023

(30) Foreign Application Priority Data

Jan. 30, 2020 (LU) ............................ LU 101 626
May 22, 2020 (LU) ............................ LU 101 816

(51) Int. Cl.
*H03K 17/687* (2006.01)
*B60N 2/00* (2006.01)
(Continued)

(52) U.S. Cl.
CPC ........... *B60N 2/002* (2013.01); *B60N 2/0021* (2023.08); *B60N 2/003* (2023.08); *B60N 2/0033* (2023.08);
(Continued)

(58) Field of Classification Search
CPC ...... H03K 17/56; H03K 17/687; H03K 17/51; H03K 17/74; H03K 17/945; H03K 17/955;
(Continued)

(56) References Cited

U.S. PATENT DOCUMENTS

2009/0295199 A1* 12/2009 Kincaid ................. B60N 2/002
297/180.12

FOREIGN PATENT DOCUMENTS

WO 2012113795 A1 8/2012

OTHER PUBLICATIONS

Search Report corresponding to International Application PCT/EP2021/051613; dated Apr. 9, 2021; 3 pages.
(Continued)

*Primary Examiner* — Justin Seo
*Assistant Examiner* — Kendrick X Liu
(74) *Attorney, Agent, or Firm* — Reising Ethington P.C.

(57) ABSTRACT

A sensor arrangement for capacitive detection of an object, including: an electrode arrangement having a heating element as an electrode; a detection device providing a detection signal to a sensor electrode and capacitively detecting the presence of an object near the sensor electrode; a high-side switch connected between a heating power source having a first potential and the heating element; a low-side switch connected between the heating element and a second potential; and a gate controller closing the high-side switch and low-side switch in a heating mode and opening the high-side switch and low-side switch in a detection mode. A
(Continued)

decoupling MOSFET is connected between the high-side switch and heating element. The gate controller closes the MOSFET in the heating mode and opens the MOSFET in the detection mode. During the detection mode, the decoupling circuit provides a third potential at a first node between the high-side switch and MOSFET.

14 Claims, 3 Drawing Sheets

(51) Int. Cl.
    *B60N 2/56*     (2006.01)
    *B62D 1/06*     (2006.01)
    *H03K 17/74*     (2006.01)
    *H03K 17/955*     (2006.01)
    *H05B 3/00*     (2006.01)
    *H05B 3/03*     (2006.01)

(52) U.S. Cl.
    CPC ........... *B60N 2/5685* (2013.01); *B62D 1/065* (2013.01); *H03K 17/687* (2013.01); *H03K 17/74* (2013.01); *H03K 17/955* (2013.01); *H05B 3/0004* (2013.01); *H05B 3/0014* (2013.01); *H05B 3/0023* (2013.01); *H05B 3/03* (2013.01); *B60N 2210/12* (2023.08); *H03K 2217/0063* (2013.01); *H03K 2217/0072* (2013.01); *H05B 2203/029* (2013.01); *H05B 2203/035* (2013.01)

(58) Field of Classification Search
    CPC ... H03K 2217/0063; H03K 2217/0072; B60N 2/002; B60N 2/5678; B60N 2/5685; B62D 1/06; B62D 1/065; H05B 3/0004; H05B 3/0014; H05B 3/0019; H05B 3/0023; H05B 3/02; H05B 3/03
    See application file for complete search history.

(56) References Cited

OTHER PUBLICATIONS

International Written Opinion corresponding to International Application PCT/EP2021/051613 dated Apr. 9, 2021; 5 pages.

* cited by examiner

SENSOR ARRANGEMENT FOR CAPACITIVE POSITION DETECTION OF AN OBJECT

TECHNICAL FIELD

The invention relates to a sensor arrangement for capacitive position detection of an object.

BACKGROUND

Capacitive detection is widely used today for various applications. In general, the capacitive detection is based on generating an electric field with a sensor electrode and detecting the presence of an object or a person by their influence on the electric field. Mostly, this influence on the electric field corresponds to a change in the complex impedance between the sensor electrode and ground or between two sensor electrodes. In some cases, a guard electrode is used to shield the sensor electrode on one side. During operation, the guard electrode ideally has the same potential as the sensor electrode so that the space between these two electrodes is free of an electric field. Examples for such capacitive detection include hand detection on a steering wheel and occupancy detection of a vehicle seat. In modern vehicles, the steering wheel as well as the vehicle seat may be equipped with an electrical heating element in order to increase the comfort of the user. In order to work effectively, the heating element and the sensor electrode often need to be installed in a similar location, for example relatively close under the surface of the steering wheel, the vehicle seat or the like.

Such installation of at least one sensor electrode and optionally one guard electrode in the vicinity of a heating element at tight conditions can be difficult, thus leading to increased assembly time and costs. One option to lower the design complexity is to use the heating element as a sensor electrode or as a guard electrode. This corresponds to a combination of a heating circuit and a capacitive measurement circuit at the same level, which is very cost-effective. In order to improve comfort, integration and sensor cost, the thickness between sense and guard is reduced, which can lead to a considerable capacitance between the two electrodes, in the order of 1 nF-20 nF. In this case, any voltage difference between the signal applied to the sensor electrode and the one applied to the guard electrode leads to an inaccurate capacitive measurement.

When the heating element is part of the capacitive sensing system, it is intermittently decoupled from the power source in order not to interfere with the operation of the measurement circuit. This can be done by using a switch and a controller for this switch to connect and disconnect the power source and the heating element. For cost and efficiency reasons this is often realised using a high-side and a low-side Switch MOSFET to disconnect the heating element from the power source and ground, respectively.

If the voltage across the (high-side or low-side) switch is not stable, the relatively large output capacitance of the MOSFETs in OFF state could lead to undesirable and varying impedances between the heating element and ground potential. These varying impedances directly affect the capacitive measurement performance when the heating element is used as a sensor electrode, but also if the heating element is used as a guard electrode, e.g. if the isolation capacitance between the sensor electrode and the heating element is large and/or if the guard driver circuit, and thus the guard voltage, is sensitive to load variation.

Another problem is that although the high-side and low-side MOSFETs are open during capacitive sensing, the heating element can still be DC coupled to the power source through the intrinsic body diodes of low impedance MOSFETs if the power supply voltage drops below the voltage applied to the heating element by the measurement circuit, thus forward biasing the respective MOSFET body diode.

In some environments, like in automotive applications, short negative voltage pulses or power micro-interruptions may occur. This can be an issue for any system which should remain fully functional during these electrical events, as the power supply transients may affect the capacitive measurement system by disturbing the sensing or guard signal, respectively, provided to the heating element and/or by overloading the capacitive detection device. Additionally, a battery reverse polarity condition could also damage the Switch MOSFETs if these exceed their maximum junction temperature.

SUMMARY

It is thus an object of the present invention to increase the accuracy of a capacitive detection that utilises a heater element as an electrode.

This problem may be solved by sensor arrangement according to claim 1.

The invention provides a sensor arrangement for capacitive detection of an object. The sensor arrangement is designed to detect the presence of an object, e.g. a person or a body part of a person, and possibly also to detect a position of the object and/or to classify the object. The sensor arrangement is designed for capacitive detection, which means that the detection of the object is based on measuring a capacitance or, respectively, a quantity that depends on a capacitance.

The sensor arrangement comprises an electrode arrangement comprising a heating element as an electrode. The electrical arrangement may comprise a single electrode or a plurality of electrodes. It will be understood that at least one electrode is a sensor electrode as explained below. One (and possibly the only) electrode of the sensor arrangement is a heating element. This heating element can be used for electrical heating, i.e. when a heating current flows through the heating element, heat is generated due to the electrical resistance of the heating element. The shape and size of the heating element and of other electrodes, if present, are not limited within the scope of the invention. The electrodes can be made of any kind of conductive material, e.g. metal sheet, metal wire, conductive foil or the like. In some embodiments, the sensor electrodes can be made of flexible material.

The sensor arrangement further comprises a detection device that is adapted to apply a detection signal to a sensor electrode of the electrode arrangement and to capacitively detect the presence of an object in the proximity of the sensor electrode. The term "detection device" is not to be construed in any limiting way as to the physical configuration. For instance, the detection device may comprise a plurality of physically spaced apart components that could be unconnected or connected wirelessly or by wire. At least some aspects of the detection device may be software-implemented. The detection device is adapted to apply a detection signal to a sensor electrode of the electrode arrangement, which implies that the detection device is connected, i.e. electrically connected, to the sensor electrode. Here and in the following "electrically connected" includes the possibility that two elements are not conductingly connected but only capacitively, e.g. via a capacitor, or inductively. The detection signal is normally an AC signal, but it could optionally comprise a DC component. The shape of the detection signal is not limited, and it could e.g. be a sinusoidal, rectangular or triangular signal. Normally, the detection signal is a voltage signal that is applied to the sensor electrode, leading to an electric field between the sensor electrode and ground (or possibly between two sensor electrodes). This electric field can be influenced by an object in the proximity of the sensor electrode. In other words, the capacitance associated with the sensor electrode is changed. This, in turn, affects the impedance of the sensor electrode and thus a relation between the voltage applied to the sensor electrode and the current flowing therethrough. There are various methods known in the art how an object can be identified and possibly classified based on the amplitude relation and/or the phase difference between the voltage and the current. The detection device is adapted to capacitively detect the object, which includes the possibility that the object can additionally be classified. More specifically, the detection device may comprise a measurement circuit that is adapted to apply the detection signal and to detect the presence of the object.

A high-side switch of the sensor arrangement is connected between a heating power source having a first potential and the heating element. The heating power source is normally a voltage source, which ideally provides a reasonably stable DC potential. However, in many applications, like in automotive systems, the respective potential is subject to fluctuations, i.e. AC components, and may even experience temporary polarity inversions. Preferably, the first potential is positive at least most of the time. The high-side switch is connected between the heating power source and the heating element, i.e. it is (directly or indirectly) connected to the heating power source and the heating element, respectively. The high-side switch has two switching states, which can be referred to as the closed state and the open state or the ON state and the OFF state.

Furthermore, a low-side switch of the sensor arrangement is connected between the heating element and a second potential. As indicated by the terms "high-side switch" and "low-side switch", the first potential is normally higher than the second potential. In particular, the second potential may be ground, i.e. ground potential. Preferably, the low-side switch is permanently connected to the heating element and to the second potential, i.e. there is no additional switch interposed by which the electrical connections can be interrupted. The connection is normally a DC connection and can be a direct connection although it would be conceivable that a passive element like a resistor is interposed between the low-side switch on the one hand and the heating element and/or the second potential on the other hand. The high-side switch also has two switching states, which can be referred to as the closed state and the open state or the ON state and the OFF state.

The sensor arrangement also comprises a gate controller that is adapted to close the high-side switch and the low-side switch in a heating mode and to open the high-side switch and the low-side switch in a detection mode. In the heating mode, the above-mentioned switches are closed and the heating element is connected between the first potential and the second potential, so that a heating current flows through the heating element. In the detection mode, which could also be referred to as a measurement mode, the switches are opened in order to interrupt the heating current. During the detection mode, the heating element serves as an electrode used for or at least facilitating capacitive detection of the above-mentioned object. Normally, the heating mode and the detection mode are performed alternatingly. In many applications, it is sufficient if detection is performed only at certain (constant or varying) intervals, e.g. every second or every couple of seconds for a few milliseconds, while heating can be performed more or less continuously with short interruptions by the detection mode. The timing of the detection mode and the heating mode can be controlled by the detection device, the gate controller or by some other device. Normally, the operation of the detection device is interrupted during the heating mode. Like the detection, the gate controller device may comprise a plurality of physically spaced apart components that could be unconnected or connected wirelessly or by wire. At least some aspects of the gate controller may be software-implemented.

The detection arrangement further comprises a decoupling circuit. The decoupling circuit may also comprise a plurality of physically spaced apart components that could be unconnected or connected wirelessly or by wire. Although this is usually unnecessary, some aspects of the decoupling circuit could be software-implemented. The decoupling circuit comprises a decoupling MOSFET connected between the high-side switch and the heating element, wherein the gate controller is adapted to close the decoupling MOSFET in the heating mode and to open the decoupling MOSFET in the detection mode. The term "decoupling MOSFET" simply expresses the function of the respective MOSFET and is not to be construed in any limiting way. This MOSFET is (directly or indirectly) connected to the high-side switch and to the heating element. One of the source and drain of the decoupling MOSFET is connected to the high-side switch and the other is connected to the heating element, either directly or indirectly via at least one intermediate element. Normally, the respective connections are direct connections. The gate controller is also (at least indirectly) connected to the decoupling MOSFET, more specifically to the gate of the decoupling MOSFET. The gate controller closes the MOSFET in the heating mode and opens the MOSFET in the detection mode, normally simultaneously with the high-side switch and the low-side switch.

Furthermore, the decoupling circuit is adapted to actively provide a third potential at a first node during detection mode, which first node is connected between the high-side switch and the decoupling MOSFET. The third potential is a DC potential and is preferably stabilised during the detection mode, e.g. in that it deviates from a mean value by less than 0.5 V, less than 0.1 V, less than 0.05 V or less than 0.01 V. The preferred stability can also depend on the application. If the heating element is used as a guard electrode as described below, the deviation from the mean value may be in the range of several hundred mV, while if the heating element is used as a sensor electrode, the deviation should be lower, e.g. below 10 mV. Also, this third potential is preferably independent of the first potential (and the second potential, if different from ground) so that possible fluctuations of the first (or second) potential do not affect the third potential. Consequently, during the detection mode, the voltage across the decoupling MOSFET is largely independent of the first potential provided by the heating power source. This is highly beneficial if the first potential is affected by fluctuations of any kind. It will be noted that in the detection mode, with the high-side switch and the decoupling MOSFET being open, the first node is normally DC decoupled from the heating power source and the heating element. Accordingly, the voltage across the decoupling MOSFET can be regarded as more or less constant.

This is also supported by an at least approximately constant potential applied by the gate controller to the gate of the decoupling MOSFET. Consequently, the capacitances associated with the decoupling MOSFET, in particular its input capacitance (also referred to as gate-source-capacitance $C_{GS}$) between the gate and the source and its output capacitance (also referred to as drain-source capacitance $C_{DS}$) between the drain and the source, are stabilised and have reduced (varying) loading impact on the heater electrode and thus on the total capacitance detected by the detection device.

According to one embodiment, the heating element is a guard electrode of the electrode arrangement. In this case, the electrical arrangement comprises at least one sensor electrode and the guard electrode, which is provided by the heating element. The guard electrode can be connected to a guard driver, which may like the above-mentioned measurement circuit be part of the detection device. Either way, the potential of the guard electrode has to be identical to the potential at the sensor electrode at any time or any differences between these potentials should be as small as possible. It will be understood that the function of the guard electrode is to prevent the generation of an electric field between the sensor electrode and the guard electrode so that the sensor electrode is non-sensitive in the direction of the guard electrode. The guard electrode can also be referred to as a shield electrode.

It is also possible that the heating element is a sensor electrode of the electrode arrangement. In this embodiment, the electrical arrangement may also comprise a guard electrode. This is normally a dedicated electrode that is only connected to the detection device. However, the guard electrode could also be a (second) heating element that could be connected between the same high-side switch and low-side switch or between two separate switches. Both heating elements could be connected to the same heating power source during heating mode, e.g. being connected in parallel between the first potential and the second potential, while they are disconnected from the first and second potential and operated separately as sensor electrode and guard electrode, respectively, during sensing mode. It will be noted that effective operation of the guard electrode and sensor electrode normally requires a stacked arrangement, which may be difficult to realise with two heating elements.

There are various conceivable applications for the inventive sensor arrangement. According to one preferred embodiment, the sensor arrangement is adapted for hand detection on a steering wheel of a vehicle, normally a land vehicle like a car. However, application to other vehicles like sea or air vehicles is also conceivable. In such an embodiment, the at least one electrode of the electrode arrangement is disposed under a surface of the steering wheel, whereby a hand of a user, and optionally a position of the hand, can be detected. Normally, the at least one electrode is disposed underneath some isolating lining that forms the physical surface of the steering wheel, which is designed to be touched by a user. The heating element, which is one electrode of the electrode arrangement, is of course disposed under the surface of the steering wheel. If the sensor arrangement comprises a sensor electrode and a guard electrode, the sensor electrode is normally disposed closer to the surface, i.e. above the guard electrode. Other components of the sensor arrangement (the detection device, the gate controller etc.) can be disposed in the steering wheel or outside thereof. It should be noted that the steering wheel could be provided with more than one inventive sensor arrangement, if this is considered advantageous.

According to another embodiment, the sensor arrangement is adapted for occupancy detection of a vehicle seat. The at least one electrode can be disposed in a seat portion or in a backrest of the vehicle seat. The respective electrode can be disposed underneath or inside a seat cushion. Again, some components of the sensor arrangement could be disposed outside the vehicle seat or inside thereof, e.g. in proximity to at least one electrode. In this embodiment, the sensor arrangement is adapted to detect an occupant on the vehicle seat, which optionally includes the possibility to distinguish an occupant from an in animate object and/or distinguish an adult from a child. Again, the vehicle seat could be provided with more than one inventive sensor arrangement.

According to one embodiment, at least one of the high-side switch and the low-side switch comprises a switch MOSFET. In particular, the respective switch may be a switch MOSFET. In this context, the term "switch MOSFET" simply serves to distinguish from the above-mentioned decoupling MOSFET and in some embodiments, these MOSFETs may even be of the same type. In a typical embodiment, the high-side switch is a first switch MOSFET and the low-side switch is a second switch MOSFET. Normally, the drain of the respective switch MOSFET is (directly or indirectly) connected to the first potential while the source is connected to the second potential. The gate of the respective switch MOSFET is connected to the gate controller, which thereby controls the impedance between the source and the drain. Both switch MOSFETs can be N-channel MOSFETs, but at least one switch MOSFET may also be a P-channel MOSFET.

It is preferred that a body diode of the decoupling MOSFET has a forward direction opposite to the forward direction of body diodes of the high-side switch and the low-side switch. As is known in the art, every MOSFET can be characterised by a body diode or intrinsic diode formed between source and drain. In this embodiment, the switches are normally switch MOSFETs that include such a body diode. The respective switch MOSFET is connected so that a forward direction of its body diode is oriented from the second potential towards the first potential. In other words, with the first potential being higher than the second potential, the respective body diode is operated in blocking direction. However, the forward direction of the body diode of the decoupling MOSFET is opposite to the directions of the body diodes of the switch MOSFETs. Accordingly, if negative voltage transients of the first voltage source occur, i.e. if the first potential temporarily is below the second potential, the body diodes of the switch MOSFETs are operated in forward direction, while the body diode of the decoupling MOSFET is operated in blocking direction, which effectively suppresses any effect of negative voltage transients on the heating element. Depending on the application, negative voltage transients may be unlikely or impossible. In such a case, it is also possible that the forward directions of all three body diodes are the same.

According to one embodiment, the decoupling MOSFET is an N-channel MOSFET. Normally, the drain is (directly or indirectly) connected to the heating element, while the source is connected to the first node, in order to achieve the above-mentioned opposite orientation of the body diode. Alternatively, the decoupling MOSFET can be a P-channel MOSFET. In this case, the drain is normally (directly or indirectly) connected to the first node, while the source is connected to the heating element. If an N-channel MOSFET is used, this normally necessitates a more complex gate controller, while on the other hand, and N-channel MOSFET normally leads to a lower output capacitance between the heating element and the first node. This is because for similar current characteristics, an N-channel MOSFET is generally smaller than a P-channel MOSFET.

There are various possibilities how the third potential at the first node can be provided. According to one embodiment, the first node is connected to a first DC voltage source via a first resistive element. The first resistive element has an electric resistance and is normally a resistor or a combination of resistors. The first DC voltage source is adapted to supply a DC voltage at least during the detection mode, which then results in a stabilised third potential at the first node. It will be noted that the third potential may not be identical to the voltage supplied by the first voltage source, due to a voltage drop at the first resistive element. Mostly, though, such a voltage drop is not relevant and can be neglected.

Preferably, the first node is AC grounded. In particular, the first node can be connected to ground via a capacitive element. The capacitive element has a capacitance, normally accompanied by no or only a negligible resistance and/or inductance. The capacitive element can be a capacitor. This embodiment greatly helps to stabilise the third potential. In particular, any transient changes of the first potential, corresponding to AC components of the voltage between the first potential and the second potential, can be largely absorbed by this AC grounding.

Furthermore, the decoupling circuit can be adapted to actively provide a fourth potential to a second node between the heating element and the low-side switch during detection mode. This fourth potential is preferably stabilised, e.g. in that it deviates from a mean value by less than 0.5 V, less than 0.1 V, less than 0.05 V or less than 0.01 V. The preferred stability can also depend on the application. If the heating element is used as a guard electrode, the deviation from the mean value may be in the range of several hundred mV, while if the heating element is used as a sensor electrode, the deviation should be lower, e.g. below 10 mV. The second node is between the heating element and the low-side switch, i.e. it is connected in series between these two elements. Normally, the second node is directly connected to the low-side switch so that it also defines the potential at a terminal of the low-side switch, normally the potential at the drain of a switch MOSFET. Therefore, the low-side switch (MOSFET) is connected between the fourth potential (normally at the drain), the second potential (normally at the source) and a potential provided by the gate controller (at the gate). With the fourth potential and the potential at the gate being reasonably stable, and output capacitance of the low-side switch (MOSFET) is also stabilised.

According to a preferred embodiment, the fourth potential is provided in that the second node is connected to a second DC voltage source via a second resistive element. Like the first resistive element, the second resistive element has an electric resistance and is normally a resistor or a combination of resistors. The second DC voltage source is adapted to supply a DC voltage at least during the detection mode, which then results in a stabilised fourth potential at the second node. It will be noted that the fourth potential may not be identical to the voltage supplied by the second voltage source, due to a voltage drop at the second resistive element.

The gate controller can be connected to the decoupling MOSFET via a third resistive element. Like the first and second resistive element, the third resistive element has an electric resistance and is normally a resistor or a combination of resistors. More specifically, the third resistive element is connected between the gate controller and the gate of the decoupling MOSFET. The function of the third resistive element is to limit the impact of loading of the input capacitance of the decoupling MOSFET.

According to one embodiment, the decoupling circuit is adapted to provide the third potential and the fourth potential so that at least one body diode of the decoupling MOSFET and the low-side switch is reverse biased in detection mode. For instance, if the decoupling MOSFET is a P-channel MOSFET with its source connected to the heating element, the third potential needs to be lower than the fourth potential during detection mode in order to reverse bias the respective body diode. Correspondingly, if the low-side switch is an N-channel MOSFET with its drain connected to the heating element, the third potential needs to be lower than the fourth potential during detection mode in order to reverse bias the respective body diode.

BRIEF DESCRIPTION OF THE DRAWINGS

Further details and advantages of the present invention will be apparent from the following detailed description of not limiting embodiments with reference to the attached drawing, wherein.

DETAILED DESCRIPTION

Figure 1:
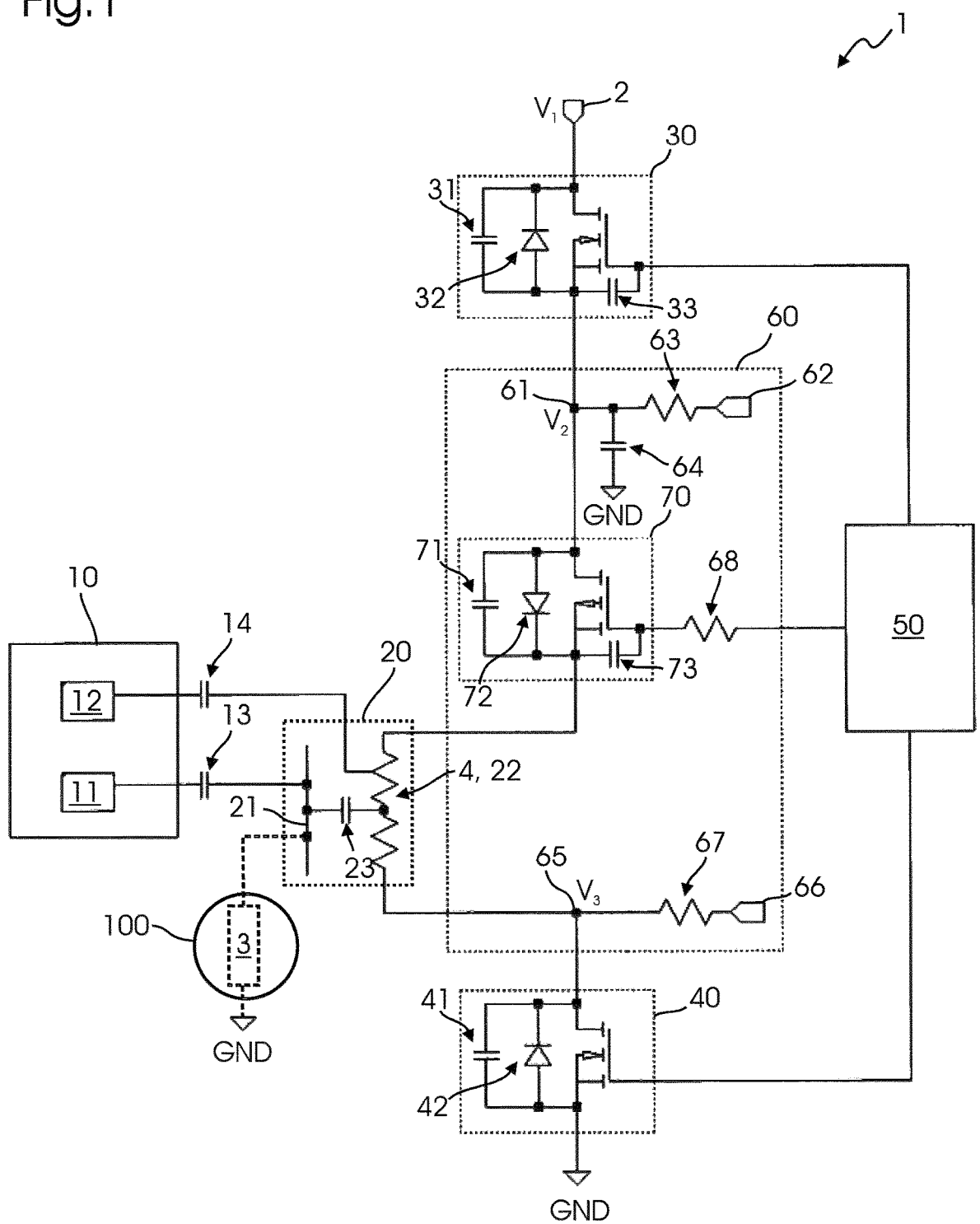
FIG. 1 is a schematic view of a first embodiment of an inventive sensor arrangement.

FIG. 1 shows a first embodiment of an inventive sensor arrangement 1 which could be used for hand detection on a steering wheel or occupancy detection on the vehicle seat. A detection device 10 is connected to an electrode arrangement 20 which comprises a sensor electrode 21 and a guard electrode 22. The guard electrode 22 is a heating element for that is connected through via a decoupling circuit 60 and two switch MOSFETs to a heating power source 2 (e.g. a battery of the vehicle) supplying a first potential $V_1$ and a second potential, in this case ground. A sensor circuit 11 of the detection device 10 is connected via a first capacitor 13 to the sensor electrode 21. In a detection mode of the sensor arrangement 1, the sensor circuit 11 applies a periodic detection signal to the sensor electrode 21 which gives rise to an electric field between the sensor electrode 21 and ground. A complex impedance 3 between the sensor electrode 21 and ground is influenced by the presence of an object 100, which can therefore be capacitive leading to by the sensor circuit 11. A guard driver 12 is connected through a second capacitor 14 to the guard electrode 22. During detection mode, the guard driver 12 is supposed to apply a periodic guard signal that is identical to the detection signal so that the sensor electrode 21 and the guard electrode 22 always have the same potential. However, if the electrodes 21, 22 have different potentials, and isolation capacitance 23 between them can considerably affect the capacitive measurement. Any disturbance of the periodic signal on the guard electrode 22 will lead to a (periodic) electrical potential between the sensor electrode 21 and guard electrode 22 and thus to a parasitic periodic current through the isolation capacitance 23. This would cause an error in the determination of the unknown impedance 3.

The heating element 4 is connected to the heating power source 2 and ground, respectively, through a high-side switch MOSFET 30 and low-side switch MOSFET 40. A gate controller 50 controls the switch MOSFETs 30, 40 to connect the heating element 4 to the power supply 2 and the ground during heating mode and to disconnect the heating element 4 from power supply 2 and ground during detection mode.

The decoupling circuit 60 comprises a decoupling MOSFET 70, also controlled by the gate controller 50 and placed in the appropriate direction between the high-side switch 30 and the heating element 4. The appropriate direction means that a body diode 72 of the decoupling MOSFET 70 has an opposite for what direction with respect to the body diode is 32, 42 of the high-side switch 30 and the low-side switch 40. During detection mode, the high-side switch 30 and the MOSFET 70 are switched off. A first node 61 between the high-side switch MOSFET 30 and the decoupling MOSFET 70 is then DC decoupled from the power supply 2 and the heating element 4 as the DC impedances of the MOSFETs 30, 70 are very high. The first node 61 is AC grounded by a third capacitor 64, preventing power supply transient voltages to be coupled to the heating element 4 through the output capacitances 31, 71 of the high-side switch MOSFET 30 and the decoupling MOSFET 70. A third potential $V_2$ of the first node 61 is fixed by a first DC voltage source 62 and a first resistor 63.

Similarly, a fourth potential $V_3$ of a second node 65, between the heater element 4 and the low-side switch MOSFET 40, is provided by a second DC voltage source 66 and a second resistor 67. The voltage across the decoupling MOSFET 70 is thus constant and less sensitive to the variations of the power supply 2. This protects the heating element 4, i.e. the guard electrode 22, from an effect of dynamic capacitive load change due to the sensitivity of the output capacitance 71 (i.e. $C_{SD}$) to voltage variations across the decoupling MOSFET 70. The DC voltage across an input capacitance 73 (i.e. $C_{GS}$) of the decoupling MOSFET 70 is also fixed by the gate controller 50 and the impact of the loading of the input capacitance 73 is limited by a third resistor 68 disposed between the gate controller 50 and the gate of the decoupling MOSFET 70. Typically, output and input capacitances of the switch MOSFETs 30, 40 present values comprised between several hundreds of pF and several nF. The DC biasing of the second node 65 also limits the changes of an output capacitance 41 of the low-side switch MOSFET 40.

As a result of the placement of the decoupling MOSFET 70, its body diode 72 prevents power supply 2 negative voltage transients from reaching the heating element 4 through intrinsic body diodes 32, 42 of the high-side and low-side switch MOSFETs 30, 40. This prevents an overload of the guard driver 12 or a disturbance of the periodic guard signal applied to the heating element 4. Resistances 63, 67 and DC voltage sources 62, 66 provide DC potentials $V_2$, $V_3$ to node 61, 65 to reverse bias the body diodes 42, 72 of the low-side switch MOSFET 40 and the decoupling MOSFET 70 so that they cannot be conductive during detection mode.

During heating, the decoupling MOSFET 70 is switched ON by the gate controller 50 and the heating power loss is limited due to the small impedance (i.e. $R_{DSON}$) of the decoupling MOSFET 70.

In FIG. 1, the decoupling MOSFET 70 is represented as a P-channel MOSFET. However, an N-channel MOSFET, with its source connected to the node 61 and its drain connected to the heating element 4, could also be used. In this case, the gate controller 50 would have to be slightly more complex to switch OFF the MOSFET 70 during a negative power supply event, i.e. a temporal inversion of the polarity of the first potential $V_1$ that could e.g. occur as part of a characteristic noise in a vehicle power network. On the other hand, the use of an N-channel MOSFET leads to a lower output capacitance 71 between the heating element 4 and the first node 61, because for similar current characteristics, N-channel MOSFETs are smaller in size than P-channel MOSFETs.

Figure 2:
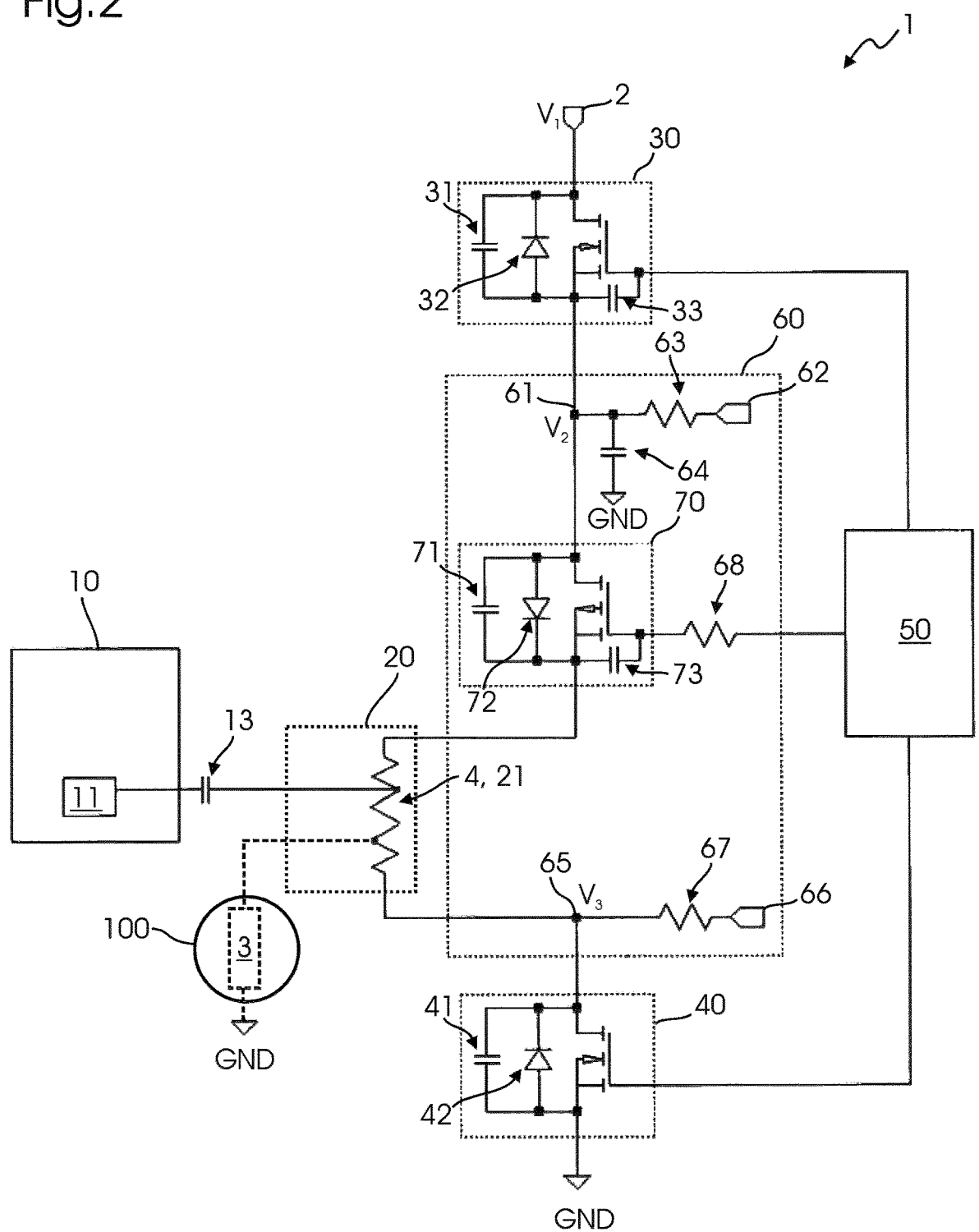
FIG. 2 is a schematic view of a second embodiment of an inventive sensor arrangement.

FIG. 2 shows a second embodiment of an inventive sensor arrangement 1 which is largely identical to the first embodiment and will insofar not be explained again. Here, the heating element 4 is used as the sensor electrode 21 during detection mode. Although not shown in FIG. 2, the sensor arrangement 1 could also comprise a guard electrode 22 connected to a guard driver 12. In this configuration, the parasitic output capacitances 31, 41, 71 of the MOSFETs 30, 40, 70 introduce a relatively large parasitic capacitance offset into the measurement of the unknown impedance 3.

Preferably, this configuration can e.g. be for seat occupancy detection when the classification of object 100 can be performed by the detection of a relatively fast variation of the unknown impedance 3 with, for instance, an appropriate adaptative baselining of the measurement of the impedance 3 (i.e. one could use an adaptive algorithm with base-lining feature that evaluates the capacitive measurement values and determines different classes that shall be discriminated by the capacitive measurement). In this case, the detection should not be sensitive to relatively slow parasitic impedance variation that are related to temperature effect. The decoupling MOSFET 70 could be either a P-channel or N-channel MOSFET as already explained.

Figure 3:
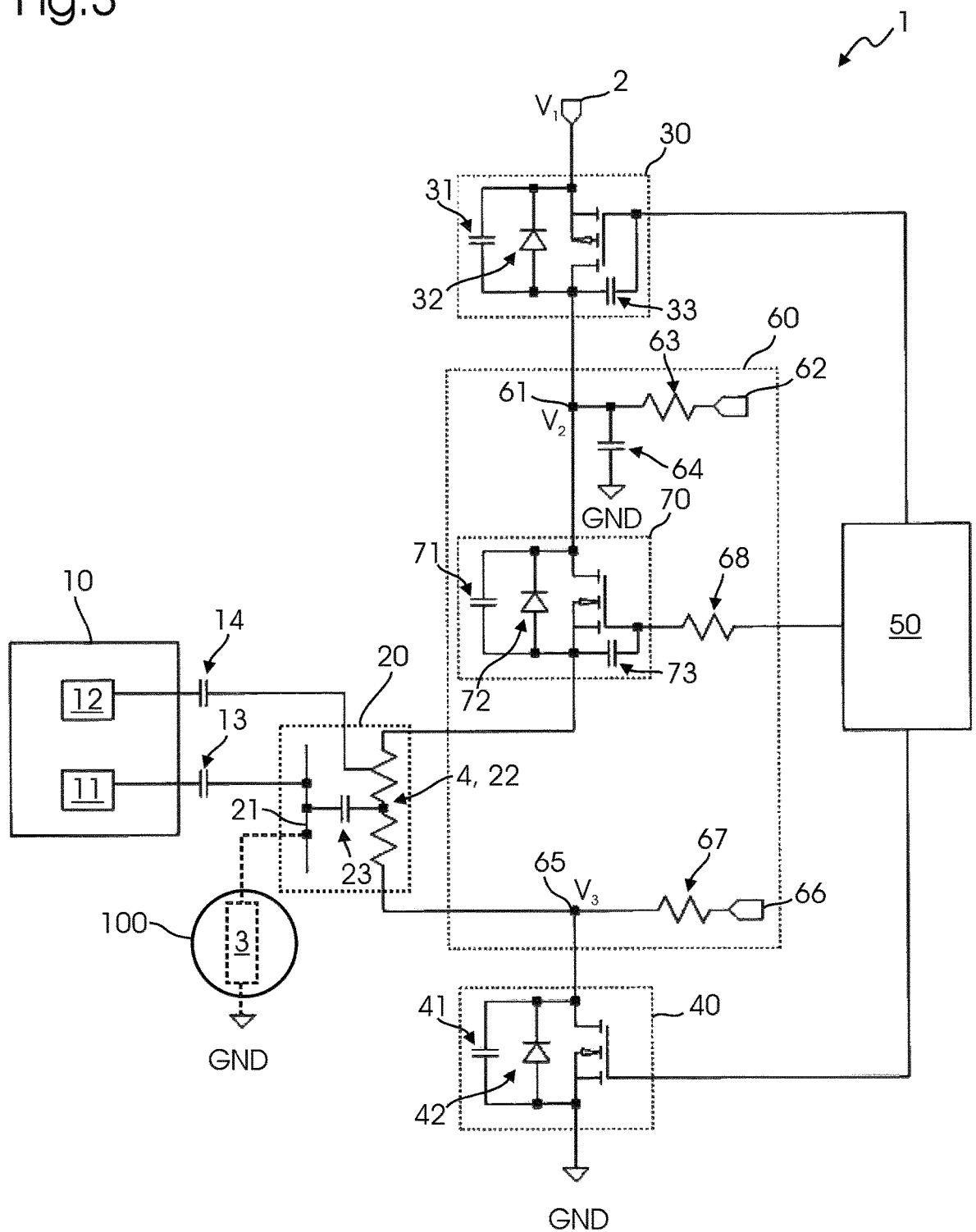
FIG. 3 is a schematic view of a third embodiment of an inventive sensor arrangement.

FIG. 3 shows a third embodiment of an inventive sensor arrangement 1, where the decoupling MOSFET 70 is an N-channel MOSFET with its body diode 72 having the same forward direction as the body diodes 32, 42 of the switch MOSFETs 30, 40. As it is not providing a reverse voltage protection, this configuration will be preferably used in a system which is not sensitive to negative power supply transients or in a system where a reverse voltage protection is already available upfront of the heating power supply 2. This configuration is offering similar decoupling of the high-side part of the heating element circuit from power supply 2. The decoupling MOSFET 70 could be either a P-channel or N-channel MOSFET.

The invention claimed is:

1. A sensor arrangement for capacitive detection of an object, comprising:
   an electrode arrangement comprising a heating element as an electrode;
   a detection device that is adapted to apply a detection signal to a sensor electrode of the electrode arrangement and to capacitively detect the presence of an object in the proximity of the sensor electrode;
   a high-side switch that is connected between a heating power source having a first potential and the heating element;
   a low-side switch that is connected between the heating element and a second potential;
   a gate controller that is adapted to close the high-side switch and the low-side switch in a heating mode and to open the high-side switch and the low-side switch in a detection mode; and
   a decoupling circuit comprising a decoupling MOSFET connected between the high-side switch and the heating element, wherein the gate controller is adapted to close the decoupling MOSFET in the heating mode and to open the decoupling MOSFET in the detection mode, the decoupling circuit is adapted to actively provide a third potential at a first node during the detection mode, the first node is connected between the high-side switch and the decoupling MOSFET, and the first node is connected to a first DC voltage source via a first resistive element.

2. A sensor arrangement according to claim 1, wherein the heating element is a guard electrode of the electrode arrangement.

3. A sensor arrangement according to claim 1, wherein the heating element is a sensor electrode of the electrode arrangement.

4. A sensor arrangement according to claim 1, wherein the sensor arrangement is adapted for hand detection on a steering wheel of a vehicle.

5. A sensor arrangement according to claim 1, wherein the sensor arrangement is adapted for occupancy detection of a vehicle seat.

6. A sensor arrangement according to claim 1, wherein at least one of the high-side switch and the low-side switch comprises a switch MOSFET.

7. A sensor arrangement according to claim 1, wherein a body diode of the decoupling MOSFET has a forward direction opposite to the forward direction of body diodes of the high-side switch and the low-side switch.

8. A sensor arrangement according to claim 1, wherein the decoupling MOSFET is an N-channel MOSFET.

9. A sensor arrangement according to claim 1, wherein the decoupling MOSFET is a P-channel MOSFET.

10. A sensor arrangement according to claim 1, wherein the decoupling circuit is adapted to actively provide a fourth potential to a second node between the heating element and the low-side switch during the detection mode.

11. A sensor arrangement according to claim 1, wherein the gate controller is connected to the decoupling MOSFET via a third resistive element.

12. A sensor arrangement according to claim 1, wherein the decoupling circuit is adapted to provide the third potential and a fourth potential so that at least one body diode of the decoupling MOSFET and the low-side switch is reverse biased in the detection mode.

13. A sensor arrangement for capacitive detection of an object, comprising:
an electrode arrangement comprising a heating element as an electrode;
a detection device that is adapted to apply a detection signal to a sensor electrode of the electrode arrangement and to capacitively detect the presence of an object in the proximity of the sensor electrode;
a high-side switch that is connected between a heating power source having a first potential and the heating element;
a low-side switch that is connected between the heating element and a second potential;
a gate controller that is adapted to close the high-side switch and the low-side switch in a heating mode and to open the high-side switch and the low-side switch in a detection mode; and
a decoupling circuit comprising a decoupling MOSFET connected between the high-side switch and the heating element, wherein the gate controller is adapted to close the decoupling MOSFET in the heating mode and to open the decoupling MOSFET in the detection mode, the decoupling circuit is adapted to actively provide a third potential at a first node during the detection mode, the first node is connected between the high-side switch and the decoupling MOSFET, and the first node is connected to ground via a capacitive element.

14. A sensor arrangement for capacitive detection of an object, comprising:
an electrode arrangement comprising a heating element as an electrode;
a detection device that is adapted to apply a detection signal to a sensor electrode of the electrode arrangement and to capacitively detect the presence of an object in the proximity of the sensor electrode;
a high-side switch that is connected between a heating power source having a first potential and the heating element;
a low-side switch that is connected between the heating element and a second potential;
a gate controller that is adapted to close the high-side switch and the low-side switch in a heating mode and to open the high-side switch and the low-side switch in a detection mode; and
a decoupling circuit comprising a decoupling MOSFET connected between the high-side switch and the heating element, wherein the gate controller is adapted to close the decoupling MOSFET in the heating mode and to open the decoupling MOSFET in the detection mode, the decoupling circuit is adapted to actively provide a third potential at a first node during the detection mode, the first node is connected between the high-side switch and the decoupling MOSFET, the decoupling circuit is adapted to actively provide a fourth potential to a second node between the heating element and the low-side switch during the detection mode, and the second node is connected to a second DC voltage source via a second resistive element.

* * * * *